(12) United States Patent
Chang

(10) Patent No.: US 7,767,106 B2
(45) Date of Patent: Aug. 3, 2010

(54) METHOD OF DRY ETCHING OXIDE SEMICONDUCTOR FILM

(75) Inventor: Chienliu Chang, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 456 days.

(21) Appl. No.: 11/775,561

(22) Filed: Jul. 10, 2007

(65) Prior Publication Data

US 2008/0038929 A1 Feb. 14, 2008

(30) Foreign Application Priority Data

Aug. 9, 2006 (JP) ............................. 2006-216857

(51) Int. Cl.
*B44C 1/22* (2006.01)
(52) U.S. Cl. ............................. 216/63; 216/71; 216/72; 216/76
(58) Field of Classification Search ............... 216/63, 216/71, 72, 76
See application file for complete search history.

(56) References Cited

U.S. PATENT DOCUMENTS

| 6,331,672 | B1 * | 12/2001 | Matsuda et al. | ............. 136/256 |
| 7,061,014 | B2 | 6/2006 | Hosono et al. | ................ 257/43 |
| 2001/0008227 | A1 * | 7/2001 | Sadamoto et al. | ............. 216/23 |
| 2003/0027407 | A1 * | 2/2003 | Koike et al. | ................. 438/478 |
| 2007/0057261 | A1 * | 3/2007 | Jeong et al. | .................... 257/77 |
| 2007/0194379 | A1 * | 8/2007 | Hosono et al. | .............. 257/347 |

FOREIGN PATENT DOCUMENTS

| JP | 3-077209 | 4/1991 |
| JP | 10-087301 | 4/1998 |
| JP | 11-335874 | 12/1999 |
| JP | 2004-103957 | 4/2004 |
| WO | WO 2005088726 A1 * | 9/2005 |

OTHER PUBLICATIONS

Nomura et al., "Room-temperature fabrication of transparent flexible thin-film transistors using amorphous oxide semiconductors", Nature, 432, pp. 488-492, Nov. 25, 2004.
Fortunato et al., "Fully transparent ZnO thin-film transistor produced at room temperature", Adv. Mater., 17, 5, pp. 590-594, Mar. 8, 2005.

* cited by examiner

*Primary Examiner*—Binh X Tran
(74) *Attorney, Agent, or Firm*—Fitzpatrick, Cella, Harper & Scinto

(57) ABSTRACT

Provided is a dry etching method for an oxide semiconductor film containing at least In, Ga, and Zn, which includes etching an oxide semiconductor film in a gas atmosphere containing a halogen-based gas.

7 Claims, 3 Drawing Sheets

METHOD OF DRY ETCHING OXIDE SEMICONDUCTOR FILM

BACKGROUND OF THE INVENTION

1. Field of the Invention

The present invention relates to a method of dry etching an oxide film containing In, Ga, and Zn (hereinafter, referred to as "In—Ga—Zn—O"). In particular, the present invention relates to a method of dry etching an oxide semiconductor film containing In—Ga—Zn—O which is employed in producing a fine electronic component such as a semiconductor device, a semiconductor integration circuit, and an electrode.

2. Description of the Related Art

In recent years, as disclosed in Japanese Patent Application Laid-Open No. 2004-103957, research and development of a semiconductor oxide film containing In—Ga—Zn—O and its deposition conditions has been extensively conducted. Particularly because the semiconductor oxide film can be formed on a resin film at low temperature, its future application of the semiconductor oxide film to a portable electronic product with light weight has been targeted.

Hitherto, the patterning of a produced film containing In—Ga—Zn—O or Ga—Zn—O has been performed by a lift-off process. The lift-off process is disclosed in, for example, K. Nomura et al., Nature, Vol. 432, 25 Nov. 2004, pp. 488-492, or E. M. C. Fortunato et al., Advanced Materials, 2005, 17, No. 5, pp. 590-594.

Japanese Patent Application Laid-Open No. H11-335874 discloses the use of a process gas containing methane for a dry etching process for a conventional transparent conductive oxide film, for example, a zinc oxide (ZnO) film.

Japanese Patent Application Laid-Open No. H03-077209 discloses a technique in which when a transparent conductive film containing ITO formed on a glass substrate is subjected to a dry etching process, reactive dry etching using a mixed gas of hydrogen and carbon hydride is performed while heating the ITO film. In addition, Japanese Patent Application Laid-Open No. H10-087301 discloses a technique of dry etching a conductive film containing $SnO_2$, $In_2O_3$, and ZnO as main components by using hydrogen iodide.

In the conventional dry etching method for a semiconductor film, a fluorine-based gas is used as an etching medium in many cases.

However, the lift-off process as described above has a problem that a photoresist is melted and deformed at high temperature. The lift-off process has another problem that when a photoresist is removed, an edge of a pattern of a deposited film is curved up, and thereafter an electric wire crossing over the pattern edge is liable to be broken, which lowers the production yield.

In addition, a photoresist patterned by photolithography is used as an etching mask for reactive ion etching (RIE). In this case, there arises a problem that a non-volatile substance is deposited on a surface of the photoresist after the etching, which makes it difficult to remove the photoresist even cleaned by an ultrasonic wave.

Accordingly, to process a film containing In—Ga—Zn—O, various etching methods for obtaining a pattern having high reproducibility and a desired shape have been studied. The etching method is roughly classified into two methods. One is wet etching in which a sample is immersed in a chemical agent, and the other one is dry etching utilizing a gaseous etching medium. In principle, the etching proceeds isotropically in the wet etching, so that there arises a problem of generating a phenomenon such as an undercut beneath a mask, peeling of a pattern due to adhesion insufficiency between the mask and the processed film, and permeation of an etchant. There arises another problem that an etching residue floats or remains on the surface of a device. Consequently, it is necessary to replace the etching liquid frequently, and that leads to large consumption of the etching liquid.

On the other hand, the dry etching method has an advantage that chemically active ions generated in a plasma bombard vertically on the surface of the substrate, so that the etched shape is faithfully transferred from the mask pattern.

As a general dry etching method, a RIE method is used. The principle of RIE is simply described as follows. An etching gas is introduced into a vacuum chamber with parallel plate electrodes, and a high frequency power is applied to the electrodes. Electrons accelerated to a high speed in a high frequency electric field ionize an etching gas due to electrolytic dissociation to form a plasma state. Radicals and ions generated in the plasma cause an etching reaction on a substrate surface. The main etching mechanisms are as follows. One thereof is a chemical reaction where active species are adsorbed onto the substrate surface to form a secondary product and then released. Another one is a physical reaction, such like a sputtering effect, where accelerated positive ions collide with the substrate to physically bombard the substrate.

However, the above-mentioned documents do not explicitly disclose the dry etching to an In—Ga—Zn—O film.

Further, the dry etching method described in Japanese Patent Application Laid-Open No. H03-077209 addressed a problem that, in a case where ITO is not heated, An In and carbon compound byproduct are deposited on the ITO film, which makes it difficult to obtain a pattern of a desired shape. Moreover, applicability of the method to a film containing In—Ga—Zn—O, an etch rate thereof, and the like are not described therein.

SUMMARY OF THE INVENTION

In order to solve the above-mentioned problems, the present invention provides a method of processing a film containing In—Ga—Zn—O with high processing accuracy. Further, the present invention also provides a dry etching method for a film containing In—Ga—Zn—O by the use of an etching gas containing a halogen-based gas at a high etch rate with high processing accuracy.

In order to solve the above-mentioned problems, the present invention has been accomplished through extensive study on a film containing In—Ga—Zn—O, deposition conditions for the film, and etching conditions therefore.

According to the present invention, there is provided a method of etching an oxide semiconductor film including In, Ga, and Zn, which includes performing etching in a gas atmosphere containing a halogen-based gas.

Further features of the present invention will become apparent from the following description of exemplary embodiments with reference to the attached drawings.

DESCRIPTION OF THE EMBODIMENTS

Figure 1:
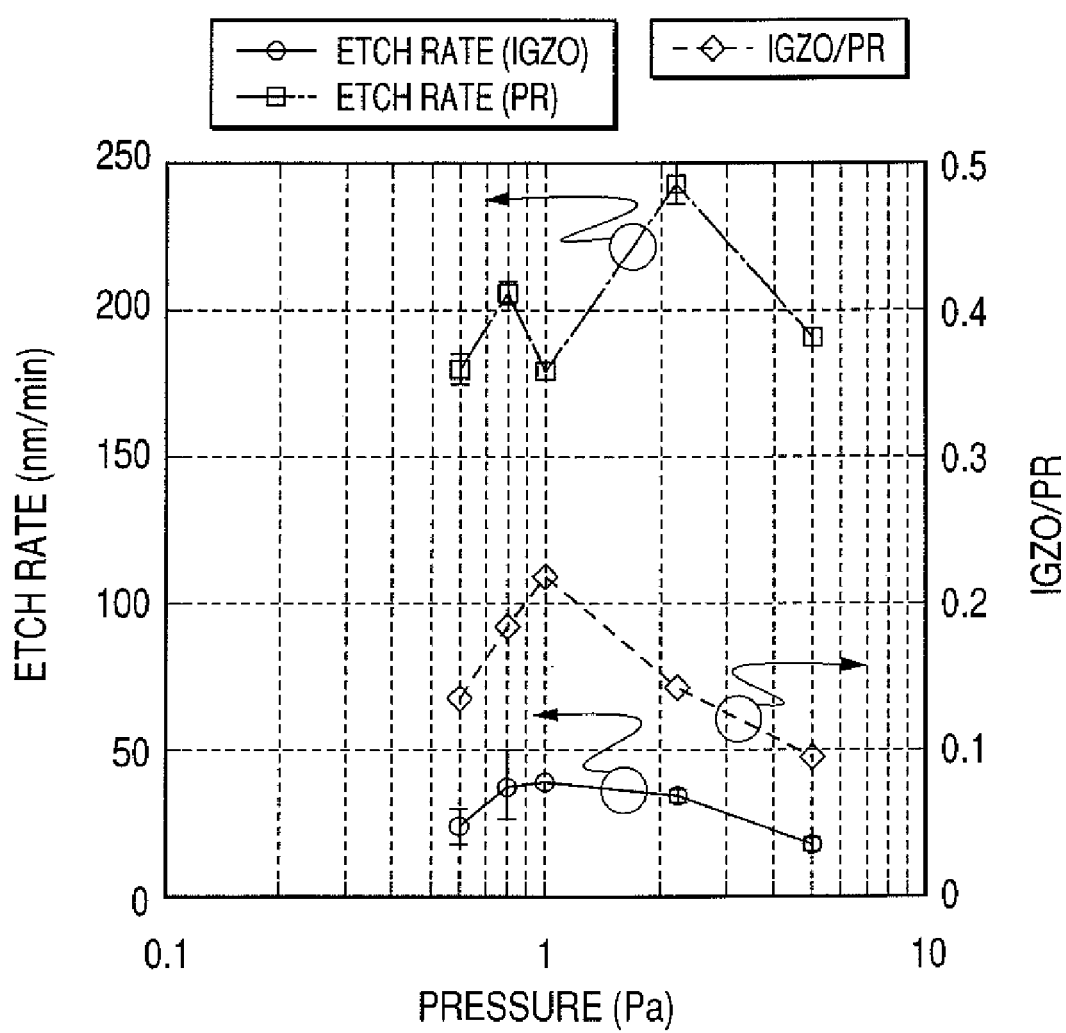
FIG. 1 is a characteristic chart illustrating the pressure dependence of the etch rates for an In—Ga—Zn—O film and a photoresist according to an example of the method of the present invention, and is also a characteristic chart illustrating the pressure dependence of the etch selectivity to photoresist.

According to the present invention, in a case where an etching gas containing a halogen-based gas is used, it is a desirable pressure condition is within a range of 0.6 Pa to 2.4 Pa. Once the pressure is lower than 0.6 Pa, exhaust of the gas itself becomes dominant, and a sufficient amount of gas for generating a plasma discharge cannot be held in an etching apparatus. On the other hand, when the pressure is higher than 2.4 Pa, a neutral gas is not completely dissociated by a plasma, and collides with dissociated ions, and consequently the etch rate is impeded. Meanwhile, a large amount of a non-volatile byproduct may be easily generated at the same time.

In general, an oxide semiconductor film is etched by use of a photoresist layer which is patterned on a surface of the oxide film as an etching mask. In addition to an organic photoresist, silicon oxide, amorphous silicon, and silicon nitride can also be used as long as it keeps durable to the etching plasma during the etching time.

Further, the etching gas may contain hydrogen or an inert gas (e.g., Ar). However, in this case, Due to the addition of an Ar gas, a higher etch selectivity to a resist can be obtained, but the etch rate decreases. Accordingly, it is desirable to determine what kind of gas is suitable in terms of productivity. Further, as the etching gas, a gas containing carbon hydride (e.g., methane ($CH_4$) or methanol ($CH_3OH$) vapor) may also be used.

According to the present invention, it is possible to significantly improve the production yield of a semiconductor device with an oxide semiconductor film containing In—Ga—Zn—O as an active layer. It is important particularly for a large-area substrate. The active layer of the semiconductor device can be produced by a deposition method such like a sputtering method, a vapor deposition method, a CVD method, an epitaxial growth method, a photoexcitation deposition method, a pulse laser deposition method, and an ion plating method. Among those methods, the sputtering method is most preferred in terms of mass producibility.

Further, since the conductivity of the oxide semiconductor film containing In—Ga—Zn—O a strong function of temperature, it is desirable to suppress a temperature rise during a dry etching process. When the temperature rises, the conductivity of the oxide semiconductor film containing In—Ga—Zn—O increases. Particularly, when the temperature becomes 200° C. or higher, the conductivity thereof becomes too high, consequently a thin-film transistor TFT with an In—Ga—Zn—O active layer does not switch to an off state. Therefore, it is desirable to set the temperature during the dry etching process under 200° C. Furthermore, the photoresist used as an etching mask may be melted and deformed at a high temperature, so that to maintain a processing temperature under 150° C. during the dry etching process is preferable.

On the other hand, once low temperature process during the dry etching is achieved, the etching profile can be kept vertical. When the temperature is excessively lowered, condensation may occur on the surface of the oxide film soon after the etching, and then the electrical characteristics of the oxide film may change due to the permeability of water molecule. In order to obviate such a problem, it is necessary to provide a load lock chamber for evacuation and temperature restoration between an etching chamber and an atmospheric pressure condition, which results in complicating a process operation and increasing costs. Further, when the temperature during the dry etching process is excessively lowered, there arises another problem that a non-volatile byproduct is easily generated. Based on the above reasons, the temperature for the dry etching process is desirably higher than 0° C. In a case where the load lock chamber cannot be provided, the temperature for the dry etching process is desirably higher than 200° C.

By adjusting the composition and film forming conditions of the oxide, it is possible to tune the electric conductivity. By the adjustment of the film deposition conditions, it is possible to get a film of the carrier concentration within a range of $10^{13}/cm^3$ to $10^{20}/cm^3$. At room temperature, it is possible to obtain an amorphous transparent oxide film containing In—Ga—Zn—O with a thickness of 200 nm and a resistivity of $10^{-2}$ to $10^5$ Ωcm. For this reason, in the TFT with the oxide thin film containing In—Ga—Zn—O, the oxide film can be used not only as an active layer but also as a pixel wire of a liquid crystal with a high conductivity. Generally, in a TFT for driving a normal liquid crystal, the off-state current is required to be less than $10^{-12}$ A, and the on-state current is required to be higher than $10^{-5}$ A. The on-state current and the off-state current depend on factors such as the structure, dimensions, and materials of the device. In consideration of the above-mentioned various requirements, in a case where the In—Ga—Zn—O oxide film is used as an active layer of a TFT, the thickness of the oxide film is desirably within a range of 5 nm or more and 400 nm or less, more desirably within a range of 10 nm or more and 300 nm or less, and most desirably within a range of 20 nm or more and 200 nm or less. According to the knowledge of the present inventor, in a case where the thickness of the oxide film is 400 nm or more, it is difficult to suppress the off-state current to $10^{-12}$ A or less. On the other hand, in a case where the thickness of the oxide film is 5 nm or less, it is difficult to increase the on-state current up to $10^{-5}$ A.

As the material of the oxide thin film, at least one kind of impurities such as Sn, Al, Sb, Cd, Ge, P. As, N, and Mg can be added to a compound containing In—Ga—Zn—O. In addition, it is desirable that impurity ions for increasing electrical resistance of the oxide thin film are not intentionally added and film deposition is performed in an atmosphere containing oxygen gas.

Further, in a case where it is intended to produce a TFT in which the oxide thin film containing In—Ga—Zn—O is used as an active layer, it is desirable that the oxide semiconductor film contains In—Ga—Zn—O and has electron carrier concentration of less than $10^{18}/cm^3$. Further, for the same reason, it is desirable to set the electron carrier concentration of the transparent amorphous oxide film to $10^9/cm^3$ or more.

In addition, as long as radials or ions of a halogen element are produced by plasma and metal atoms contained in the oxide semiconductor film can be gasified, any kind of plasma sources can be used. For example, a high-frequency inductively coupled plasma (ICP) etching apparatus and a reactive ion etching (RIE) apparatus of parallel plates may be used. Additionally, a microwave plasma etching (electron cyclotron resonance (ECR)) apparatus and a magnetron plasma etching apparatus may also be used. Further, by using a plasma etching apparatus of a barrel type, an etching apparatus of a down flow type, or the like, the same effect can be expected.

EXAMPLES

In the following description, specific examples of the dry etching method for the film containing In—Ga—Zn—O according to the present invention will be described. However, the present invention is not particularly limited to the examples.

First, a sample for an experiment was produced by a procedure described below. A Si substrate (thickness: 525 μm) having a Si oxide film with a thickness of 100 nm formed thereon was used as a base layer. Under the conditions as shown in Table 1, an In—Ga—Zn—$O_4$ film having a thickness of 900 nm was formed by a reactive sputtering method.

TABLE 1

| Target | In—Ga—Zn—$O_4$ |
|---|---|
| Substrate | Room Temperature |
| Temperature | (60° C. or less) |
| Ar flow rate | 50 sccm |
| $O_2$ flow rate | 0.6 sccm |
| Pressure | 0.326 Pa |
| RF power | 150 W |
| Time | 40 minutes |
| Film Thickness | 900 nm |

By the sputtering film forming method and by the use of a polycrystalline sintered body having an In—Ga—Zn—$O_4$ composition as a target, an In—Ga—Zn—O-based amorphous oxide semiconductor thin film containing micro crystals was deposited on the substrate. Further, when incidence X-ray diffraction (incidence angle: 0.5 degree) for the In—Ga—Zn—O-based thin film was performed, no distinct diffraction peak was found. Accordingly, it can be said that the In—Ga—Zn—O-based thin film thus produced was amorphous.

Next, a line-and-space resist pattern having a line width of 3 μm and a space width of 3 μm was formed by a known photolithography method on the In—Ga—Zn—O film. As a resist, a positive resist AZ1500 (20 cp) (trade name; manufactured by Clariant International Ltd.) was used. The Si substrate with the resist was subjected to hard baking at a temperature of about 120° C. using a baking furnace, thereby producing the sample for the experiment. The hard baking process was for improving the plasma resistance of the resist during the reactive dry etching performed subsequently.

Next, the In—Ga—Zn—O film exposed from the resist pattern on the sample thus produced was subjected to dry etching with an etching gas containing chlorine. The dry etching apparatus used was a RIE-101iP-CIP etching system (trade name; manufactured by SAMCO Inc. of a high-frequency inductively coupled plasma (ICP) system which was operated with an upper coil being used as an anode electrode and a substrate being disposed on a cathode electrode. A power supply with a high frequency of 13.56 MHz was used for each of the anode electrode and the cathode electrode, it was possible to stably control a high-density plasma and a bias. A high-frequency power applied to the coil (anode electrode) was referred to as "ICP RF power", and a high-frequency power applied to a holder (cathode electrode) provided immediately below the substrate was referred to as "bias RF power". When the RF power applied to the ICP coil was increased, the degree of dissociation of the ions and radicals in the plasma was increased.

Next, the sample was put in a chamber and evacuation was performed. After a sufficient degree of vacuum of $1 \times 10^{-4}$ Pa or less was attained, respective gases were caused to flow to excite a plasma, thereby performing etching under various conditions.

After completion of the etching, the resist of each sample was stripped with acetone, and the pattern of the In—Ga—Zn—O film was measured and observed. A step formed by the etching was measured with a surface profiler manufactured by KLA-Tencor Corporation, thereby correctly calculating a dry etch rate. Depending on the experimental conditions, appropriate etching conditions described later were made apparent. In addition, not only the etch rate for the In—Ga—Zn—O film but also the etch rate for Si were measured.

In Experiment 1, the pressure dependence was studied. As the experimental conditions, the set temperature was 35° C., the pure chlorine flow rate was 20 sccm, ICP RF power was 300 W, and bias RF power was 30 W. The results of the consideration were illustrated in FIG. 1. In FIG. 1, the abscissa indicates the chamber pressure, the left ordinate indicates the etch rate, and the right ordinate indicates the etch selectivity to the resist. The pressure was adjusted within a range of 0.6 Pa to 5 Pa. According to the experiment, in a case where the pressure was 0.6 Pa or less, the plasma became unstable or could not be excited in some cases. On the other hand, in a case where the pressure was 5 Pa or more, the plasma became dark or could not be excited in some cases. As is seen from FIG. 1, the etch rate for the In—Ga—Zn—O (IGZO) film is much smaller than the etch rate for the resist (PR). The ratio between the etch rates is represented as the etch selectivity to the resist indicated by the right ordinate. Within the range of the pressure of 0.6 Pa to 2.4 Pa, it is found that the selectivity to the resist is 0.13 or more. Particularly in a case of a pressure of 1 Pa, the desirable selectivity to a resist of 0.22 can be obtained.

From the above experimental result, a most desirable chamber pressure condition during the etching is within the range of the chamber pressure of 0.6 Pa to 2.4 Pa. In this case, it is seen that the selectivity to the resist is 0.13 or more. In consideration of practical etching conditions and plasma excitation conditions, it is desirable to obtain high selectivity to a resist within the above-mentioned range of pressure.

Figure 2:
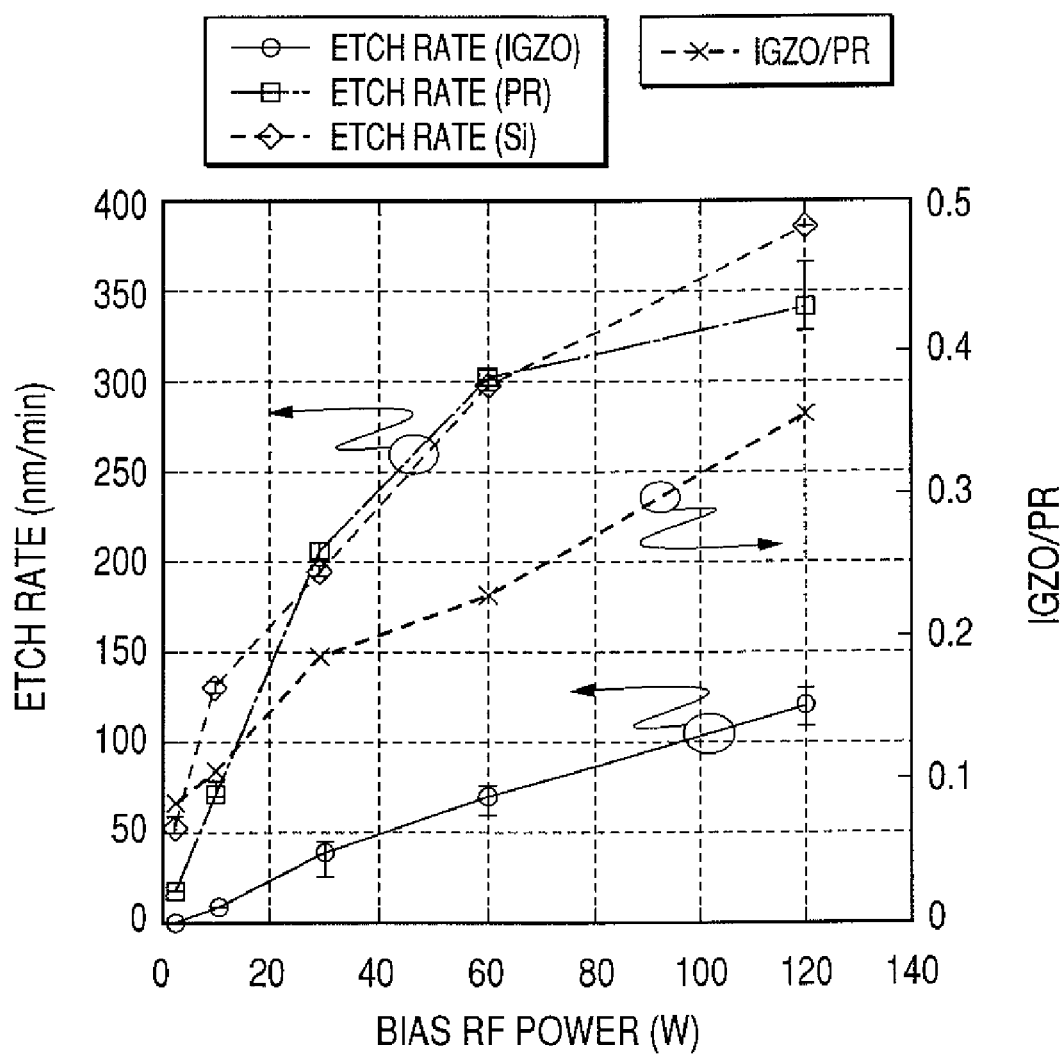
FIG. 2 is a characteristic chart illustrating the dependence on bias RF power of the etch rates for an In—Ga—Zn—O film, a photoresist, and Si, according to an example of the method of the present invention, and is also a characteristic chart illustrating a relationship between the bias RF power and etch selectivity to a photoresist.

In Experiment 2, the dependency on a bias RF power applied to a substrate side was studied. As the experimental conditions, the set temperature was 35° C., the pure chlorine flow rate was 20 sccm, the ICP RF power was 300 W, and the pressure was 0.8 Pa. The results of consideration are illustrated in FIG. 2. In FIG. 2, the abscissa indicates the bias RF power, the left ordinate indicates the etch rate, and the right ordinates indicates the etch selectivity to a resist. As is seen from FIG. 2, there is a tendency in which when the bias RF power becomes larger, the entire etch rate and the selectivity to a resist are also increased. This may be because when the RF power is high, the ions in the plasma have higher kinetic energy, thereby obtaining a large effect of a physical impact.

As is seen from FIG. 2, when the bias RF power is approximate to 0, the etch rate is also approximate to 0. This is because, in a case where the bias RF power is 0, even when the ICP RF power is increased, the ions in the plasma are not accelerated, thereby exhibiting no etching effect of the physical impact. Particularly with respect to the In—Ga—Zn—O film, the effect of the physical impact is larger than the effect of the chemical corrosion reaction. In other words, application of the bias RF power to the substrate side is one of necessary conditions for reliably performing the etching. As illustrated in FIG. 2, in a case where the bias RF power is 2 W, the etch rate for the In—Ga—Zn—O film is only 1.03 nm/min, which is a smallest etch rate in this example. Incidentally, the diameter of an electrode provided on the substrate side is 4 inches, and when the bias RF power is 2 W, the bias RF power density is about 0.02 W/cm$^2$.

A high-speed etching process suitable for mass production is desirable. From the experimental result, it is seen that desirable bias RF power density is 0.02 W/cm$^2$ or more, and most desirable bias RF power density is 0.2 W/cm$^2$ or more. When the bias RF power density becomes higher and exceeds the range of the present invention, the photoresist is melted and deformed at the high temperature, and the etching cannot be performed with accuracy in some cases.

On the other hand, as illustrated in FIG. 2, in a case where the bias RF power is 120 W (power density of about 6 W/cm$^2$), the etch rate for the In—Ga—Zn—O film is 120 nm/min.

As is seen from FIG. 2, the etch rate for Si and the etch rate for the resist are close to each other. Accordingly, Si has anti-etching ability for chlorine plasma which is the same as that of the resist.

Figure 3:
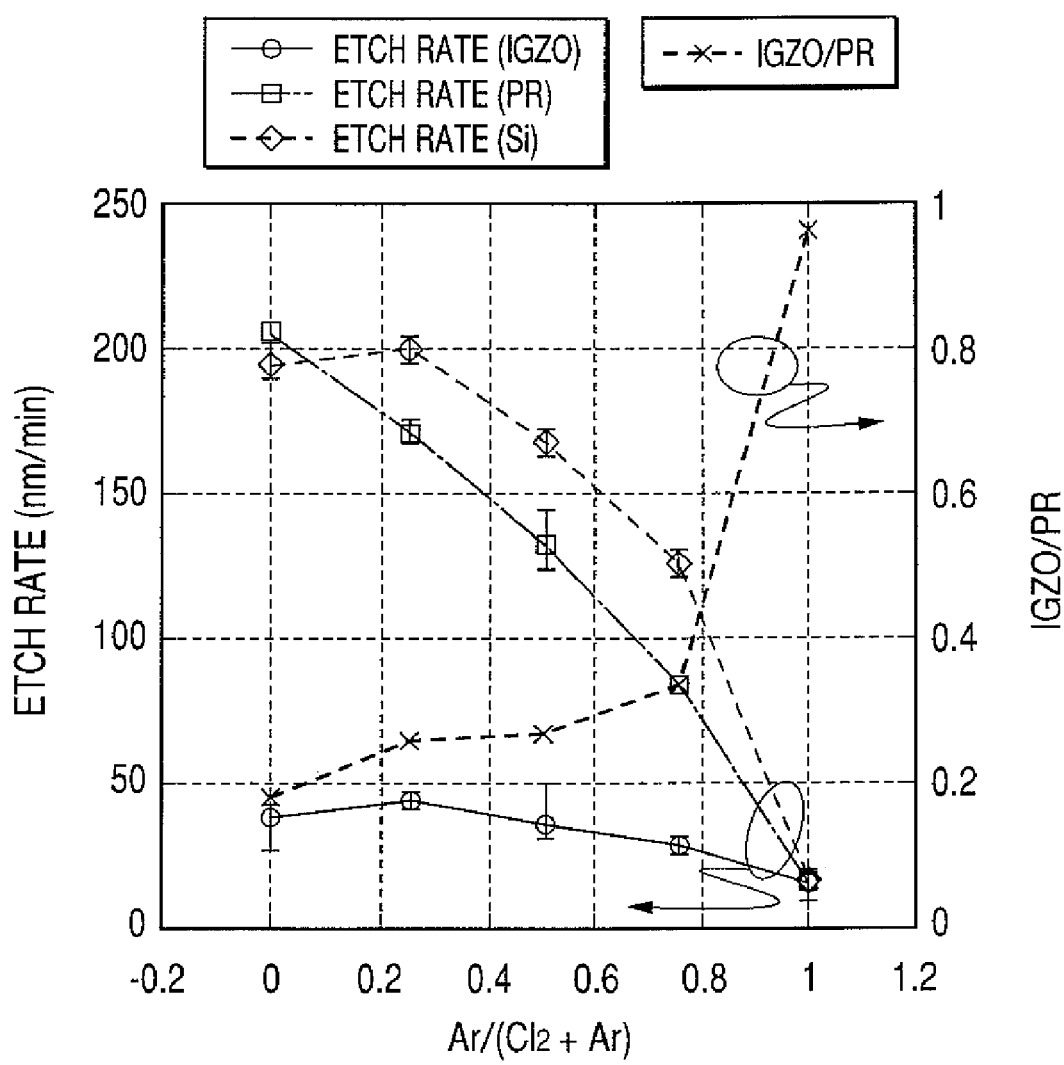
FIG. 3 is a characteristic chart illustrating a relationship between the Ar ratio of the etching gas and the etch rates for an In—Ga—Zn—O film, a photoresist, and Si according to an example of the method of the present invention, and is also a characteristic chart illustrating a relationship between the Ar ratio of the etching gas and etch selectivity to a photoresist.

In Experiment 3, the effect of Ar gas addition to chlorine gas was studied. As experimental conditions, the set temperature was 35° C., the pressure was 0.8 Pa, the entire flow rate for a mixed gas was 20 sccm, the ICP RF power was 300 W, and the bias RF power was 30 W. The results of consideration are illustrated in FIG. 3. In FIG. 3, the abscissa indicates the flow rate for Ar, the left ordinate indicates the etch rate, and the right ordinate indicates the selectivity to the resist. As is seen from FIG. 3, when the ratio of Ar is increased, the etch rate for Si and the etch rate for the resist rapidly decrease. Accordingly, a tendency in which the etch selectivity to the resist is also increased is noteworthy. There is a tendency in which as the ratio of Ar is increased, the entire etch rate decreases, and the both values are close to each other. Thus, it was confirmed that the selectivity to the resist was approximate to 1. In a case where etching is performed with pure Ar, the maximum selectivity to the resist of 0.96 can be obtained. On the other hand, in a case where the ratio of chlorine is large, the effect of the chemical corrosion reaction is larger than the effect of the physical impact, with respect to Si and the resist. As a result, the etch rate for Si is larger than the etch rate for the resist. Further, as is seen from FIG. 3, in a case where the ratio of Ar is 25%, the etch rate for the In—Ga—Zn—O film becomes maximum. By addition of Ar, the degree of dissociation of plasma becomes higher, whereby the plasma with a high density can be obtained. When an excessive amount of Ar is added (in a case of 25% or more), a chemical etching effect of chlorine radials or ions becomes small, which decreases the etch rate for the In—Ga—Zn—O film.

Similar to the results of FIG. 2, it is seen also from FIG. 3 that the plasma etching resistance tendencies for Si and the resist are close to each other. As an etching mask, instead of the organic photoresist, a material such as amorphous silicon, silicon oxide, and silicon nitride may be used. In FIG. 3, in an extreme case, that is, in a case where etching is performed with pure Ar, the etch rate for each of the In—Ga—Zn—O film, the photoresist, and the silicon are the same. From the results of Experiments 1 to 3 of this example, the etch selectivity to the photoresist of the In—Ga—Zn—O film is within a range of 0.03 to 0.98. Moreover, the necessary film thickness of the photoresist is about 1.0 to 33.4 times of the thickness of the In—Ga—Zn—O film. For this reason, the film thickness of the etching mask (e.g., photoresist) is required to be equal to or larger than the thickness of the In—Ga—Zn—O film.

After the entire dry etching process is finished, the sample was observed with an optical microscope and a scanning electron microscope. As a result, on a surface of the resist serving as an etching mask, no non-volatile deposit was observed.

In addition, in the entire dry etching process, in order to stabilize the temperature of the substrate, a coolant is caused to flow inside the holder of the substrate and the substrate temperature is set to about 35° C. When the temperature is measured by the use of a Thermo Label (manufactured by former Nicihyu Giken Kogyo CO., Ltd), after etching is performed for 4 minutes with coil RF power of 300 W and bias RF power of 30 W, it is seen that the temperature rises to about 55° C., which is a maximum temperature of the etching process according to this example.

While the etching gas source mainly used in the example is chlorine, as long as radicals or ions of the halogen element can be produced by plasma, any other sources may be used. For example, by using fluorine ($F_2$), HBr, HI, HCl, $SiCl_4$, $CF_2Cl_2$, $CF_4$, or the like, the same effect can be expected.

When the plasma power density in the case of the dry etching for the film containing In—Ga—Zn—O using high-frequency plasma is 2 W/cm$^2$ or more, the dry etching can be performed at a high speed in practical use.

According to the present invention, it is possible to prevent adverse effects due to a reaction deposit. As a result, in the case of the dry etching for the film containing In—Ga—Zn—O, the dry etching can be performed with high uniformity at a high etch rate.

For example, in a production process for a transistor device in which an oxide semiconductor film containing In—Ga—Zn—O is used as a channel layer of a thin film transistor formed on a substrate, more practical etching with high reproducibility can be performed.

According to the present invention, it is possible to obtain a dry etching process for an oxide semiconductor film containing In—Ga—Zn—O and formed on a substrate, and to provide a semiconductor device formed on a substrate with stability and uniform electrical characteristics.

For example, the present invention can be first applied to a TFT in which a transparent oxide film is formed on a soft plastic film and is used as an active layer, and further can be applied to fields of a pixel driver for a flexible display, an IC card for authentication, a product ID tag, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-216857, filed Aug. 9, 2006, which is hereby incorporated by reference herein in its entirety.

What is claimed is:

1. A method of dry etching an oxide semiconductor film including In, Ga, and Zn, which comprises performing etching in a gas atmosphere containing a halogen-based gas, wherein a reaction pressure during the etching is within a range of 0.6 Pa or more and 2.4 Pa or less, and wherein a bias RF power is applied at a density of 0.02 W/cm$^2$ or more to a substrate side during the etching.

2. The dry etching method according to claim 1, wherein a surface temperature the oxide semiconductor film during the etching is maintained at a temperature within a range of 0° C. or more and less than 200° C.

3. The dry etching method according to claim 1, wherein the oxide semiconductor film has an electron carrier concentration of less than $10^{18}/cm^3$.

4. The dry etching method according to claim 1, wherein the oxide semiconductor film has a thickness within a range of 5 nm or more and 400 nm or less.

5. The dry etching method according to claim 1, wherein the gas atmosphere additionally contains Ar gas in an amount no greater than 25% by volume.

6. The dry etching method according to claim 1, wherein the etching is performed while covering a part of a surface of the oxide semiconductor film with an etching mask comprising a material selected from the group consisting of an organic photoresist, silicon oxide, amorphous silicon, and silicon nitride.

7. The dry etching method according to claim 6, wherein the etching mask has a thickness which is equal to or larger than a thickness of the oxide semiconductor film.

* * * * *